United States Patent
Huang

(10) Patent No.: US 12,279,416 B2
(45) Date of Patent: Apr. 15, 2025

(54) SEMICONDUCTOR DEVICE WITH AIR GAP AND METHOD FOR PREPARING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/744,975

(22) Filed: Jun. 17, 2024

(65) Prior Publication Data

US 2024/0341087 A1 Oct. 10, 2024

Related U.S. Application Data

(62) Division of application No. 18/197,821, filed on May 16, 2023, now Pat. No. 12,213,307, which is a division of application No. 17/870,073, filed on Jul. 21, 2022, now Pat. No. 12,213,306.

(51) Int. Cl.
*H10B 12/00* (2023.01)

(52) U.S. Cl.
CPC .......... *H10B 12/482* (2023.02); *H10B 12/30* (2023.02)

(58) Field of Classification Search
CPC ...... H10B 12/482; H10B 12/30; H10B 12/01; H10B 12/485; H01L 21/764
See application file for complete search history.

(56) References Cited

U.S. PATENT DOCUMENTS

2012/0292746 A1* 11/2012 Lee .................. H01L 21/76898
257/621

* cited by examiner

*Primary Examiner* — Mohammed R Alam
(74) *Attorney, Agent, or Firm* — Xuan Zhang

(57) ABSTRACT

A semiconductor device includes a bottom barrier layer disposed over a semiconductor substrate, and a conductive contact disposed over the bottom barrier layer. The semiconductor device also includes a top barrier layer disposed over the conductive contact. The bottom barrier layer, the conductive contact, and the top barrier layer form an I-shaped structure. The semiconductor device further includes an isolation layer disposed adjacent to the I-shaped structure and extending into the semiconductor substrate. An air gap is surrounded by the isolation layer.

7 Claims, 19 Drawing Sheets

SEMICONDUCTOR DEVICE WITH AIR GAP AND METHOD FOR PREPARING THE SAME

CROSS-REFERENCE TO RELATED APPLICATION

This application is a divisional application of U.S. Non-Provisional application Ser. No. 18/197,821 filed 16 May 2023, which is a divisional application of U.S. Non-Provisional application Ser. No. 17/870,073 filed 21 Jul. 2022. The entirety of the above-mentioned patent application is hereby incorporated by reference herein and made a part of this specification.

TECHNICAL FIELD

The present disclosure relates to a semiconductor device and a method for preparing the same, and more particularly, to a semiconductor device with an air gap and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a bottom barrier layer disposed over a semiconductor substrate, and a conductive contact disposed over the bottom barrier layer. The semiconductor device also includes a top barrier layer disposed over the conductive contact. The bottom barrier layer, the conductive contact, and the top barrier layer form an I-shaped structure. The semiconductor device further includes an isolation layer disposed adjacent to the I-shaped structure and extending into the semiconductor substrate. An air gap is surrounded by the isolation layer.

In an embodiment, the isolation layer includes vanadium. In an embodiment, the semiconductor device further includes a first lining layer separating the isolation layer from the top barrier layer, the conductive contact, the bottom barrier layer, and the semiconductor substrate. In an embodiment, the first lining layer is in direct contact with a top surface of the bottom barrier layer and a bottom surface of the top barrier layer. In an embodiment, the semiconductor device further includes a second lining layer covering the first lining layer and the isolation layer. In an embodiment, a material of the first lining layer is the same as a material of the second lining layer.

In an embodiment, the bottom barrier layer has a middle line, a distance between the middle line and a top surface of the bottom barrier layer is substantially equal to a distance between the middle line and a bottom surface of the bottom barrier layer, and a bottommost point of the air gap is located between the middle line and the bottom surface of the bottom barrier layer. In an embodiment, the top barrier layer has a middle line, a distance between the middle line and a top surface of the top barrier layer is substantially equal to a distance between the middle line and a bottom surface of the top barrier layer, and a topmost point of the air gap is located between the middle line and the bottom surface of the top barrier layer.

In another embodiment of the present disclosure, a semiconductor device is provided. The semiconductor device includes a bottom barrier layer disposed over a semiconductor substrate, and a conductive contact disposed over the bottom barrier layer. The semiconductor device also includes a top barrier layer disposed over the conductive contact. A width of the bottom barrier layer and a width of the top barrier layer are greater than a width of the conductive contact. The semiconductor device further includes an isolation layer disposed adjacent to the conductive contact and extending into the semiconductor substrate. An air gap is sealed in the isolation layer.

In an embodiment, the isolation layer includes a vanadium-containing oxide layer. In an embodiment, a top surface of the isolation layer is concave. In an embodiment, the width of the bottom barrier layer is substantially the same as the width of the top barrier layer. In an embodiment, a material of the top barrier layer is the same as a material of the bottom barrier layer. In an embodiment, the top barrier layer and the conductive contact include different materials.

In an embodiment, the semiconductor device further includes an anti-reflective layer disposed over the top barrier layer, and a first lining layer covering a top surface of the anti-reflective layer and separating the isolation layer from the top barrier layer, the conductive contact, the bottom barrier layer, and the semiconductor substrate. In an embodiment, the semiconductor device further includes a second lining layer covering the first lining layer and the isolation layer, wherein the second lining layer is separated from the anti-reflective layer by the first lining layer. In an embodiment, the first lining layer and the second lining layer include $Si_3N_4$.

In yet another embodiment of the present disclosure, a method for preparing a semiconductor device is provided. The method includes forming a bottom barrier material over a semiconductor substrate, and forming a conductive material over the bottom barrier material. The method also includes forming a top barrier material over the conductive material, and etching the top barrier material, the conductive material, the bottom barrier material, and the semiconductor substrate to form an opening. Remaining portions of the top barrier material, the conductive material, and the bottom barrier material form an I-shaped structure. The method further includes depositing an isolation layer in the opening such that an air gap is formed in the isolation layer.

In an embodiment, the isolation layer includes vanadium, and the isolation layer is deposited by an atomic layer deposition (ALD) process. In an embodiment, the remaining portion of the bottom barrier layer has a first width, the remaining portion of the conductive contact has a second width, and the remaining portion of the top barrier layer has a third width. In addition, the first width is substantially the same as the third width, and the second width is greater than the first width. In an embodiment, the opening is formed by a dry etching process using a chlorine-based etchant. In an embodiment, a lower portion of the opening has a fourth width, a middle portion of the opening has a fifth width, and an upper portion of the opening has a sixth width. In addition, the fifth width is greater than the fourth width and the sixth width.

In an embodiment, the method further includes forming an anti-reflective material over the top barrier material before the opening is formed, wherein the anti-reflective material is etched during the forming of the opening. In an embodiment, the method further includes forming a first lining layer covering sidewalls of the I-shaped structure before the isolation layer is deposited. In an embodiment, the method further includes forming a second lining layer over the first lining layer and the isolation layer, wherein a material of the first lining layer is the same as a material of the second lining layer.

Embodiments of a semiconductor device and method for preparing the same are provided in the disclosure. In some embodiments, the semiconductor device includes a bottom barrier layer, a conductive contact disposed over the bottom barrier layer, and a top barrier layer disposed over the conductive contact. In some embodiments, the semiconductor device also includes an isolation layer disposed adjacent to the conductive contact. The bottom barrier layer, the conductive contact, and the top barrier layer collectively form a structure having an I-shape, which can help to form an air gap in the isolation layer during the process of depositing the isolation layer. Therefore, the parasitic capacitance between the conductive contact and adjacent conductive features can be reduced. As a result, the overall device performance can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Figure 13:
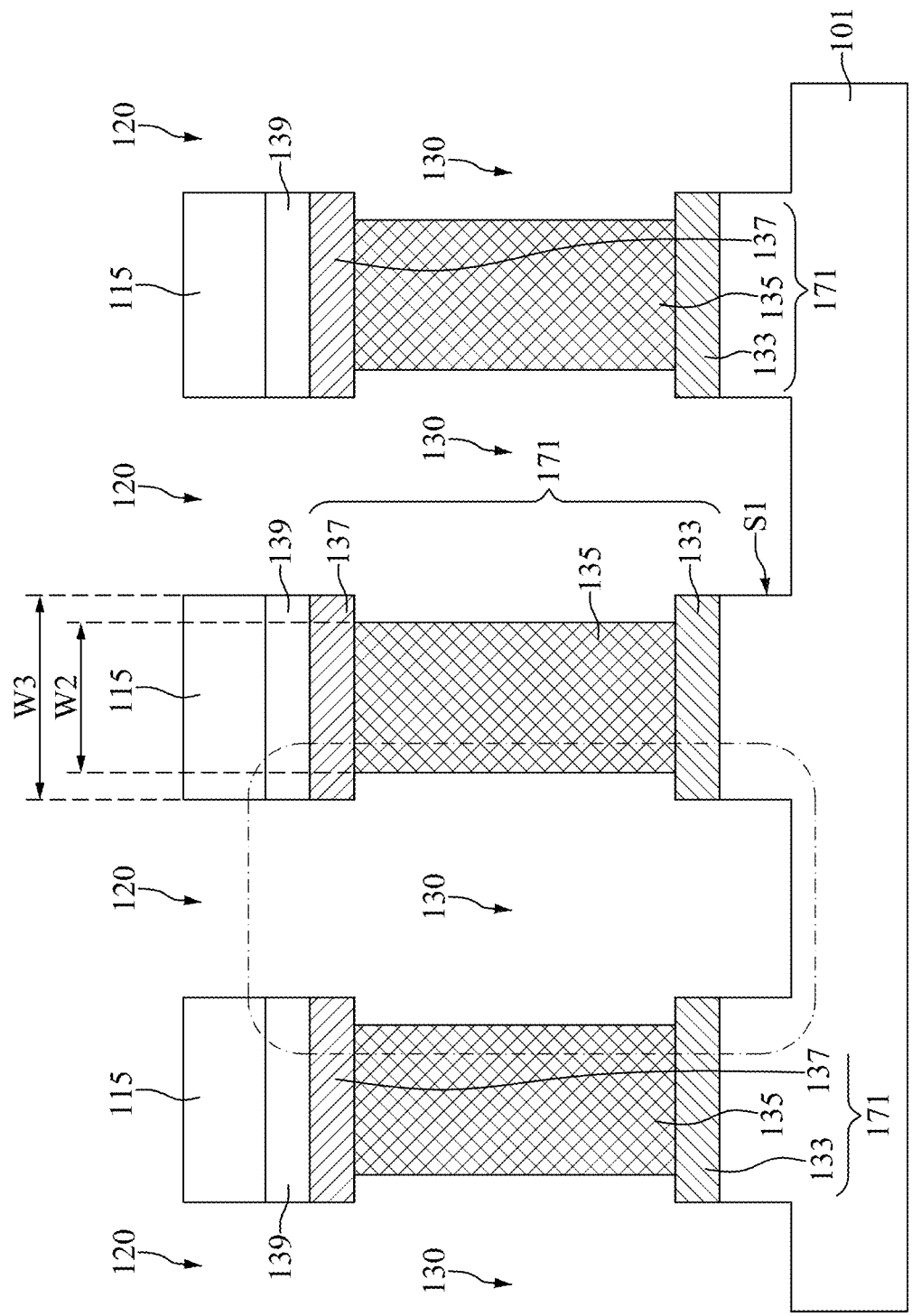

FIG. 13 is a cross-sectional view illustrating an intermediate stage of etching the top barrier material, the conductive material, the bottom barrier material, and the semiconductor substrate to form an opening, and remaining portions of the top barrier material, the conductive material, and the bottom barrier material form an I-shaped structure during the formation of the semiconductor device, in accordance with some embodiments.

Figure 14:
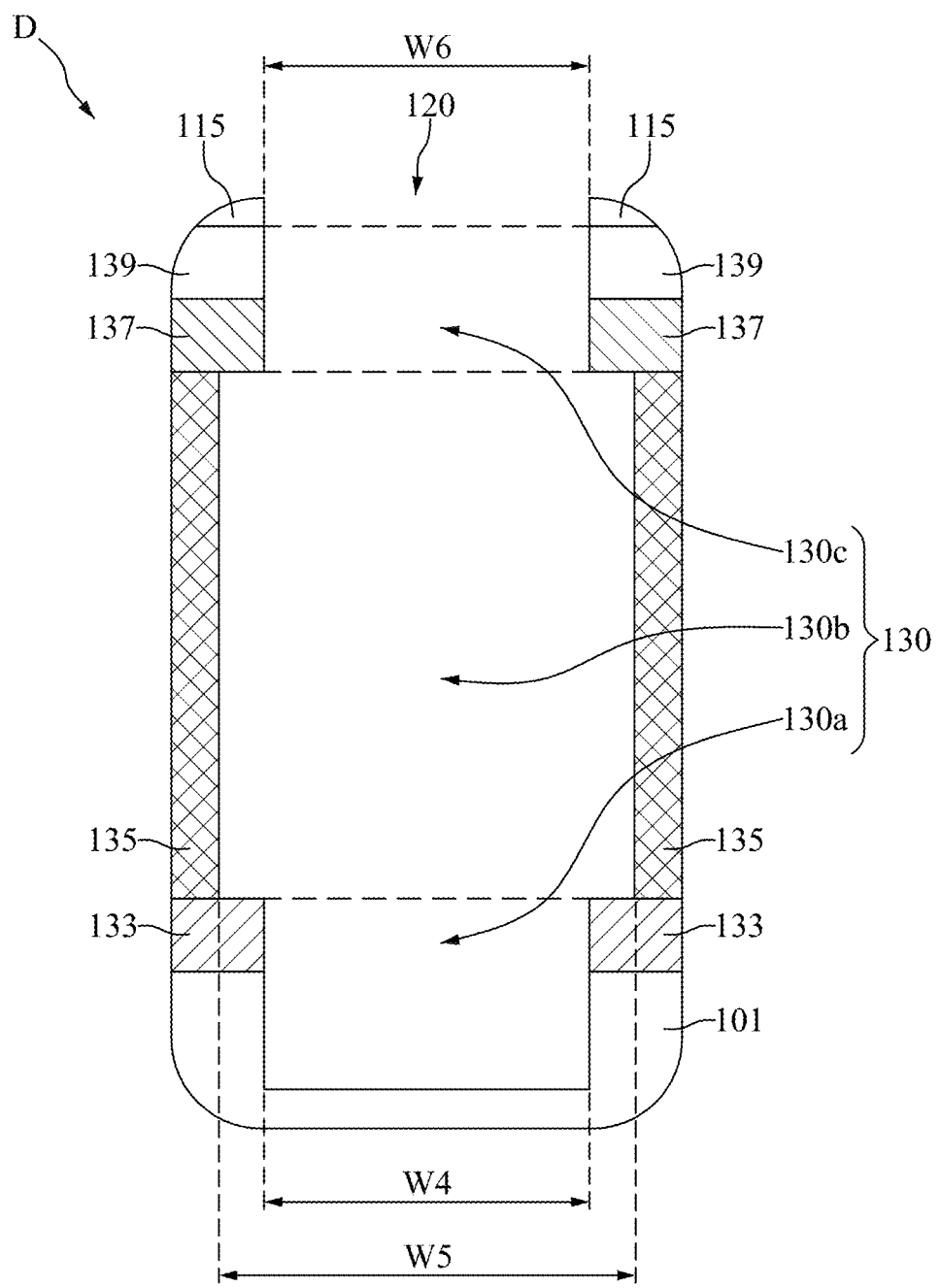

FIG. 14 is an enlarged view of a portion of the semiconductor device in FIG. 13, in accordance with some embodiments.

Figure 15:
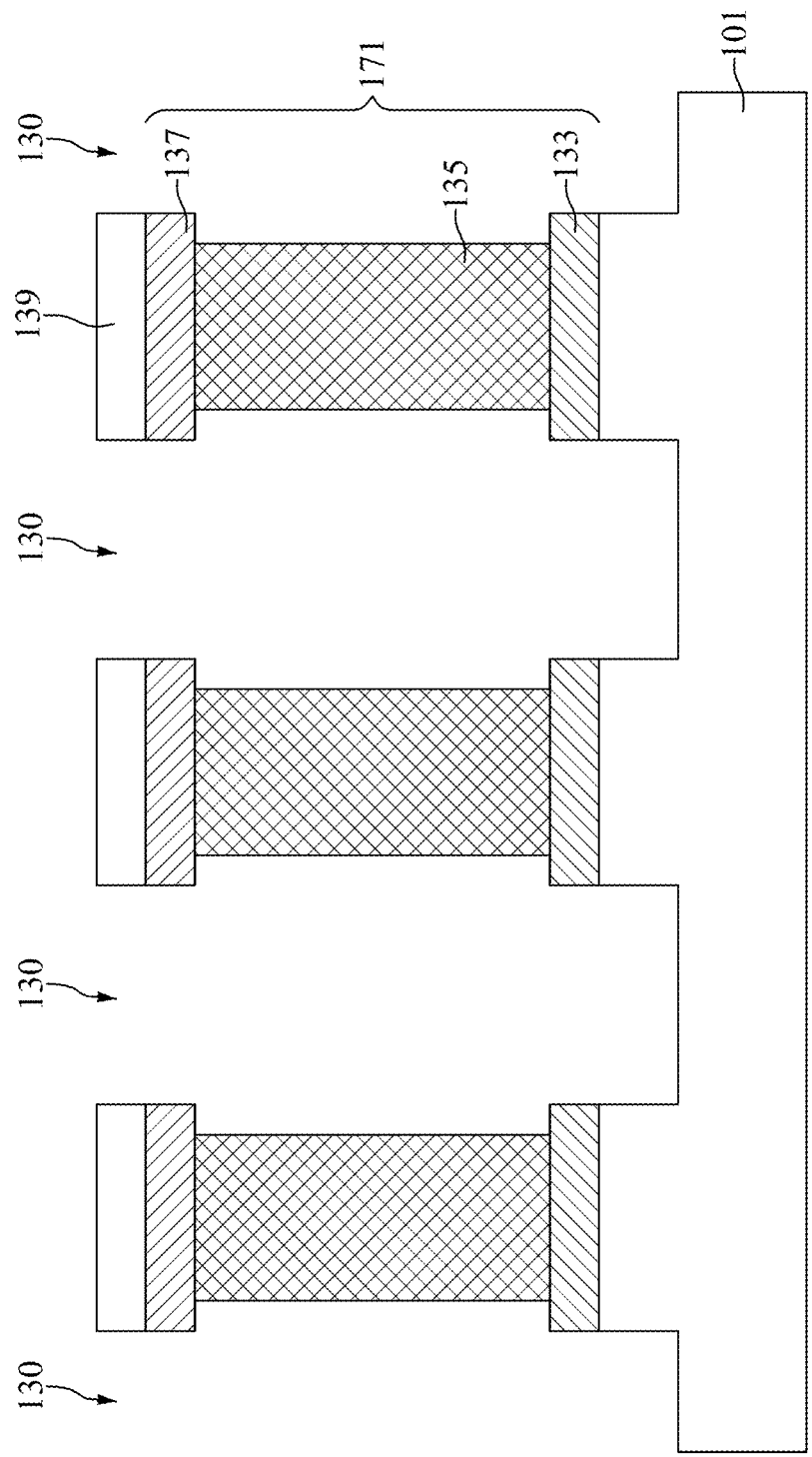

FIG. 15 is a cross-sectional view illustrating an intermediate stage of removing the patterned mask during the formation of the semiconductor device, in accordance with some embodiments.

Figure 16:
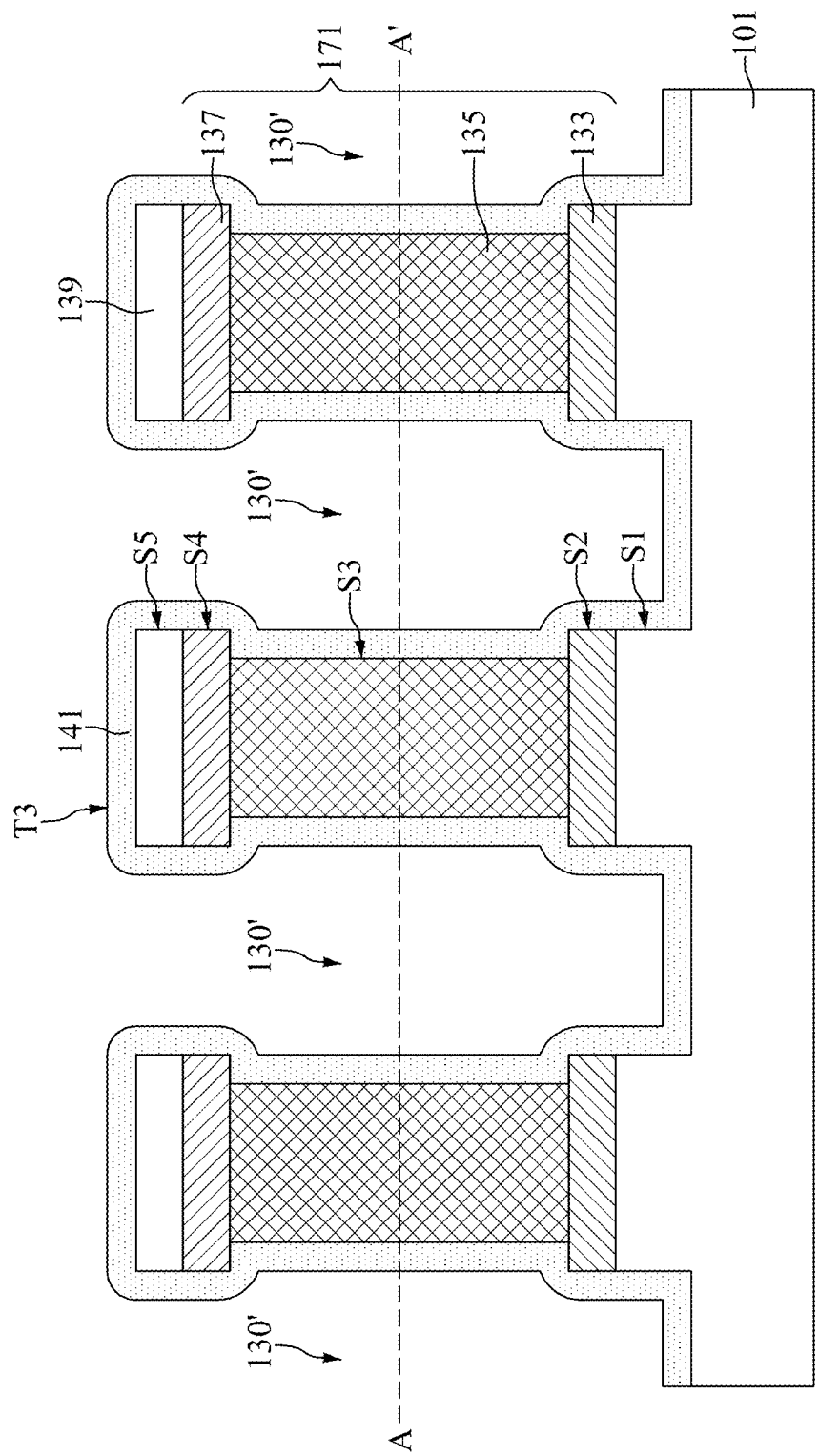

FIG. 16 is a cross-sectional view illustrating an intermediate stage of forming a first lining layer during the formation of the semiconductor device, in accordance with some embodiments.

Figure 17:
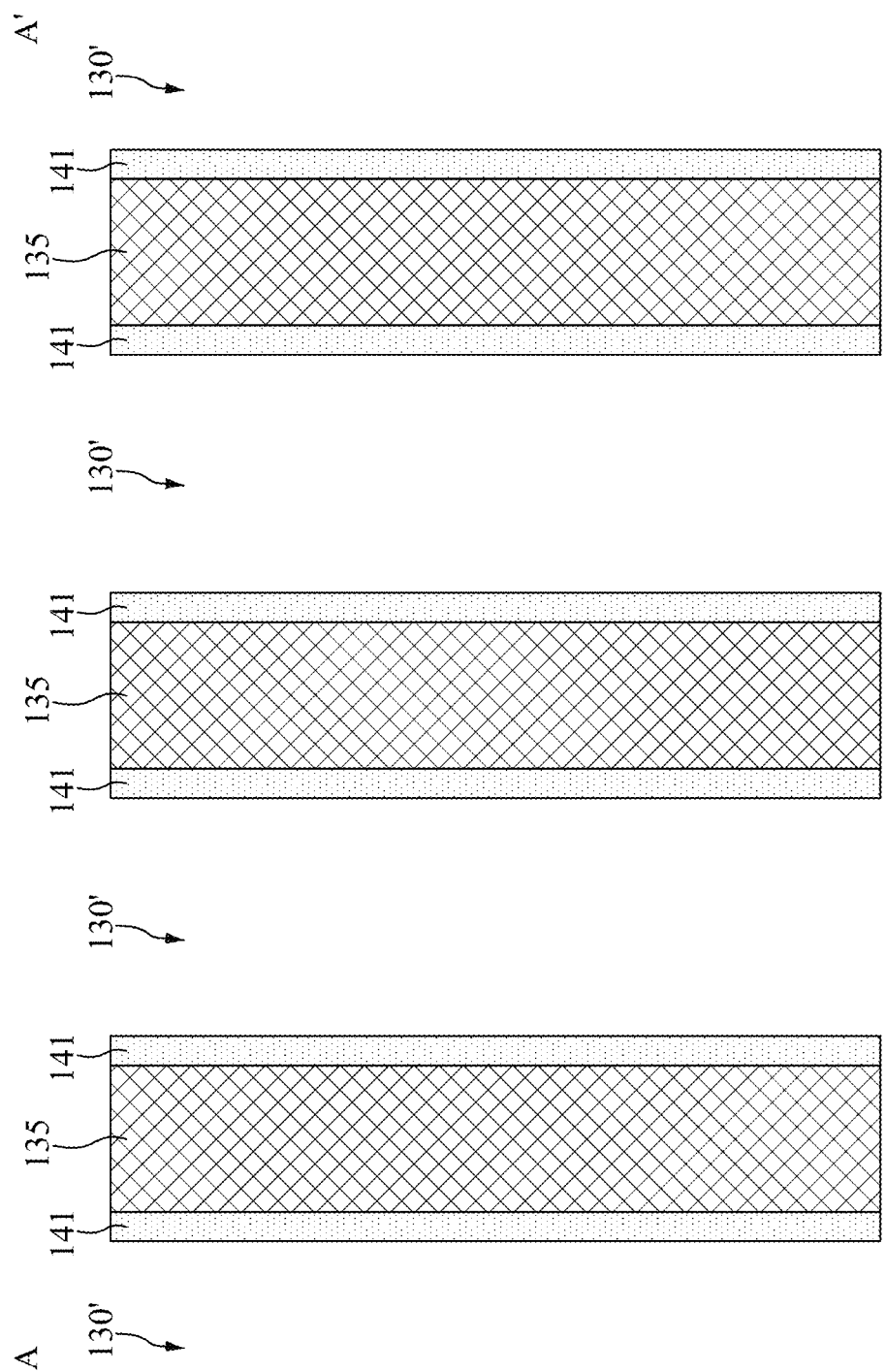

FIG. 17 is a cross-sectional view taken along line A-A' in FIG. 16, in accordance with some embodiments.

Figure 18:
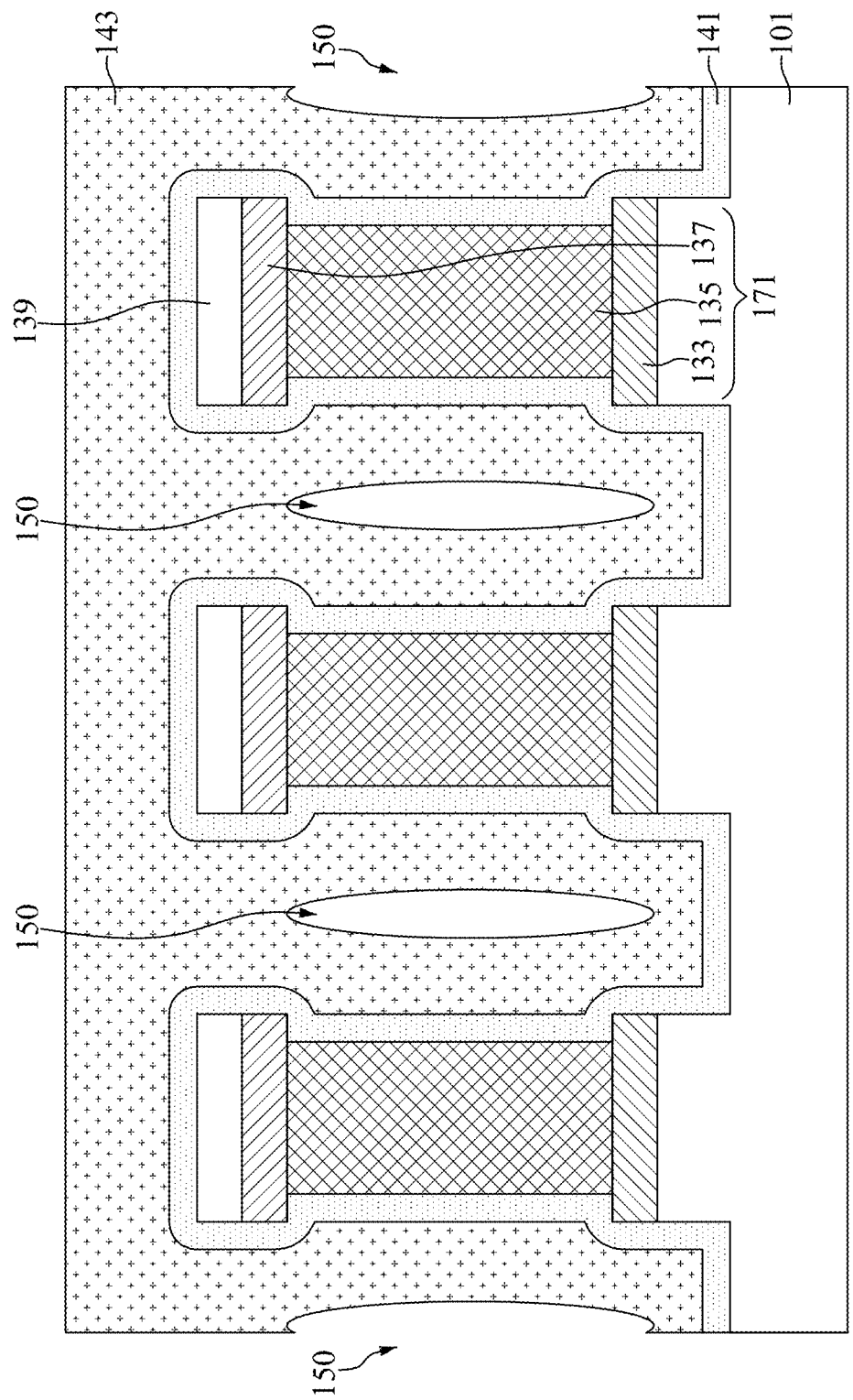

FIG. 18 is a cross-sectional view illustrating an intermediate stage of depositing an isolation layer in the opening such that an air gap is formed in the isolation layer during the formation of the semiconductor device, in accordance with some embodiments.

Figure 19:
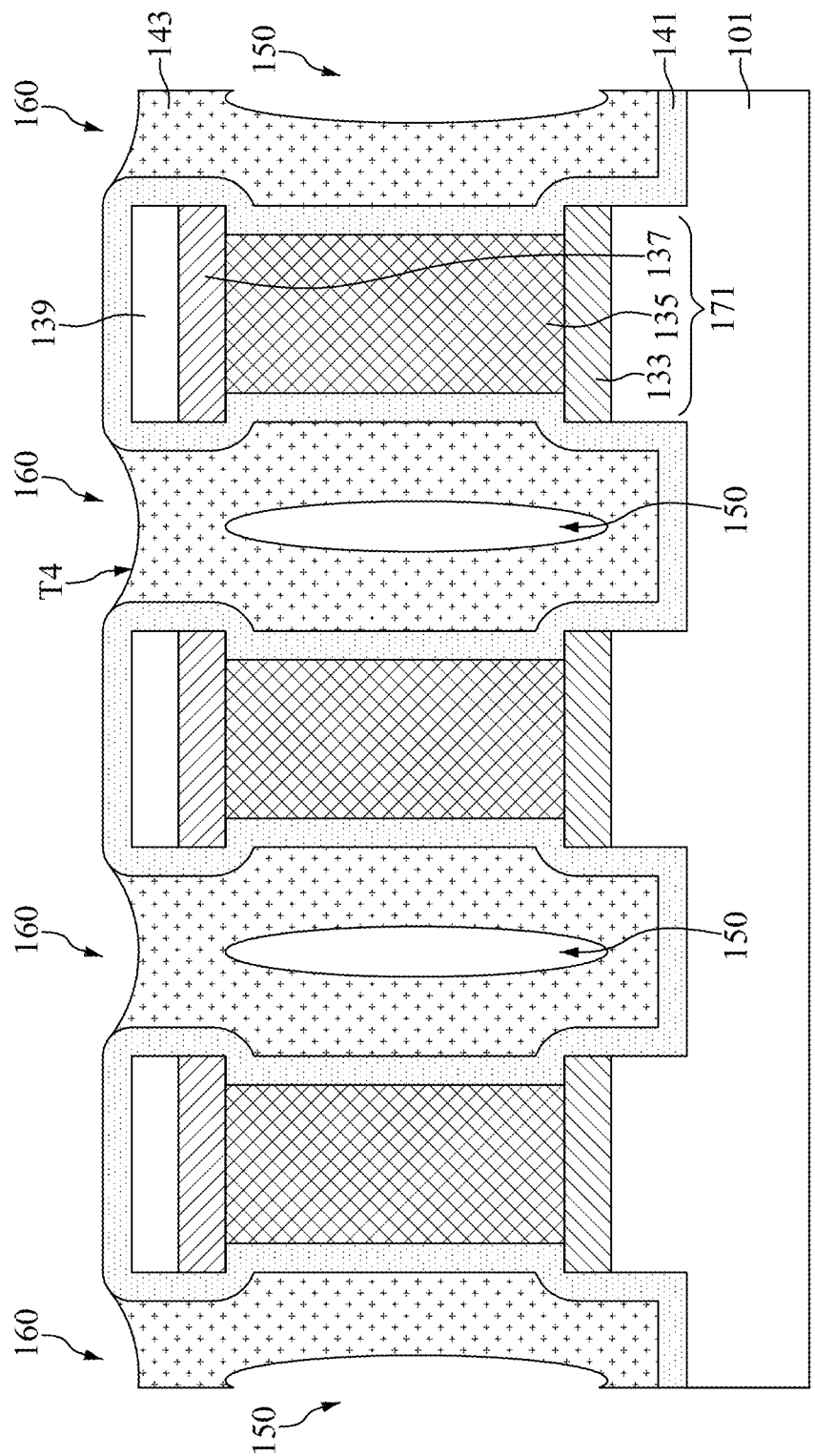

FIG. 19 is a cross-sectional view illustrating an intermediate stage of depositing an isolation layer in the opening such that an air gap is formed in the isolation layer during the formation of the semiconductor device, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
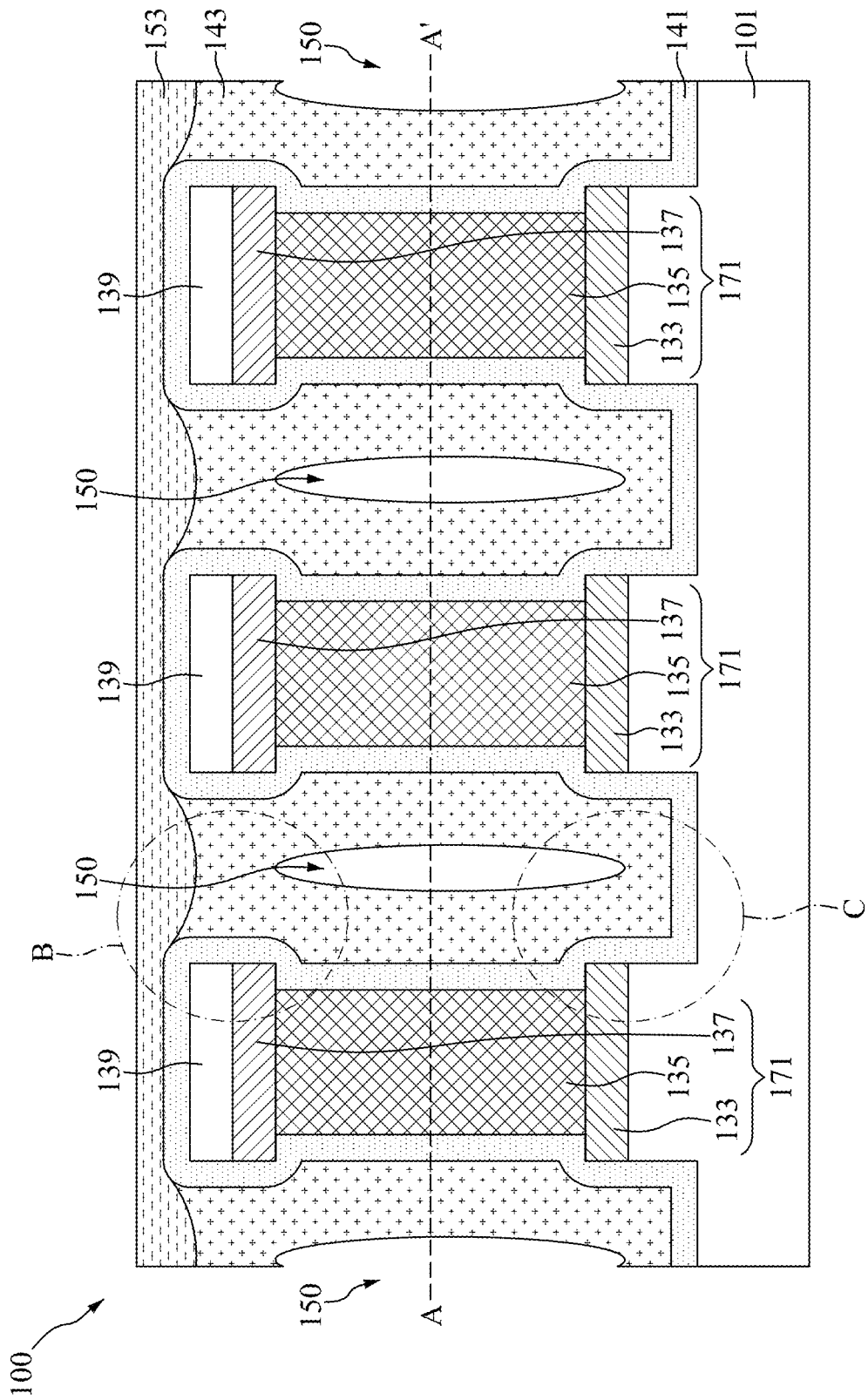
FIG. 1 is a cross-sectional view illustrating a semiconductor device, in accordance with some embodiments.
Figure 2:
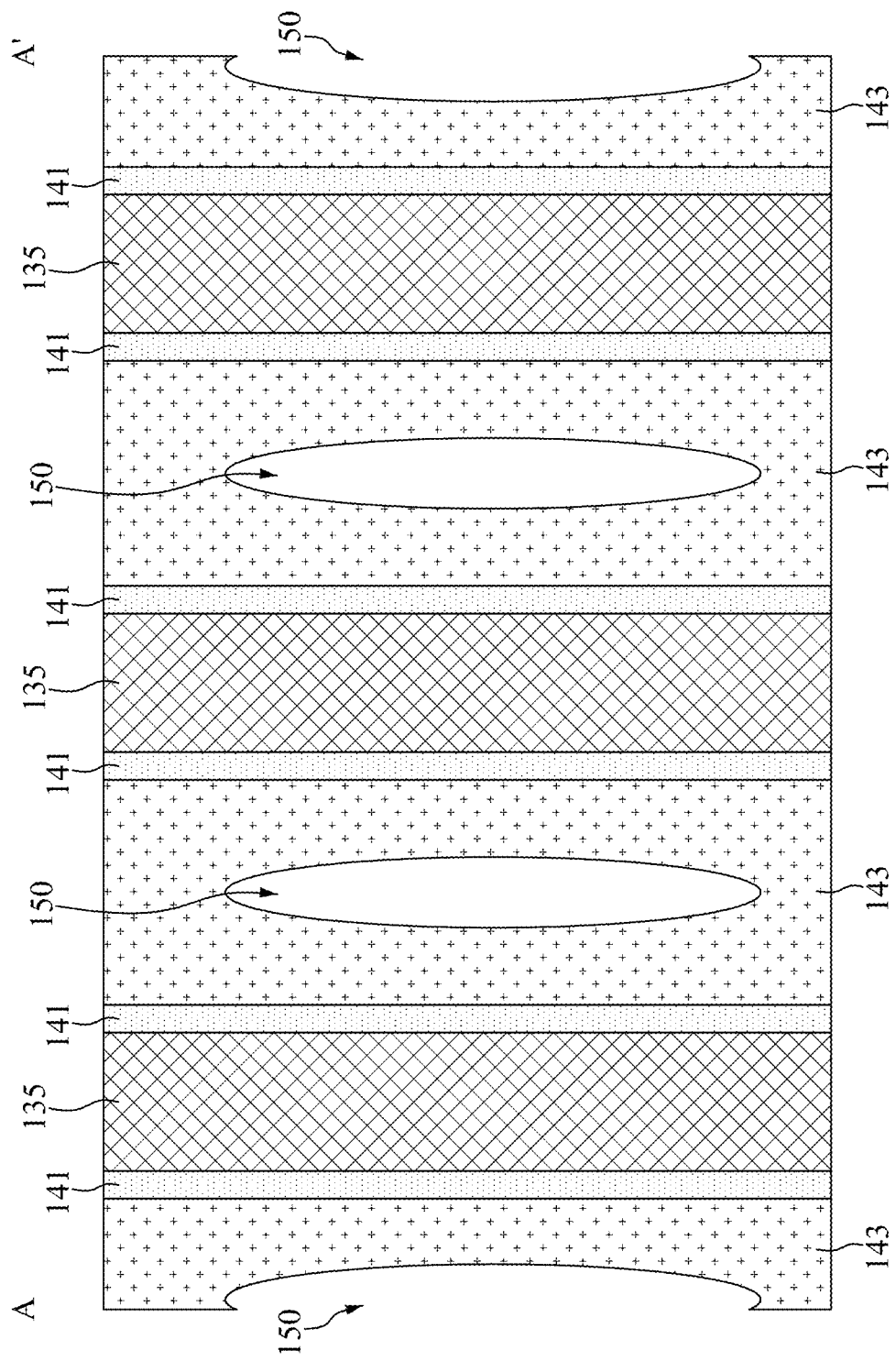
FIG. 2 is a cross-sectional view taken along line A-A' in FIG. 1, in accordance with some embodiments.

FIG. 1 is a cross-sectional view illustrating a semiconductor device 100, and FIG. 2 is a cross-sectional view taken along line A-A' in FIG. 1, in accordance with some embodiments. In some embodiments, the semiconductor device 100 includes a semiconductor substrate 101, a plurality of bottom barrier layers 133 disposed over the semiconductor substrate 101, a plurality of conductive contacts 135 disposed over the bottom barrier layers 133, a plurality of top barrier layers 137 disposed over the conductive contacts 135, and a plurality of anti-reflective layers 139 disposed over the top barrier layers 137. In some embodiments, the conductive contacts 135 and their corresponding bottom barrier layers 133 and top barrier layers 137 form a plurality of I-shaped structures 171.

In some embodiments, each of the I-shaped structures 171 includes a conductive contact 135, an underlying bottom barrier layer 133, and an overlying top barrier layer 137. Moreover, the semiconductor device 100 includes a first lining layer 141 covering the top surfaces and the sidewalls of the anti-reflective layers 139 and covering the sidewalls of the I-shaped structures 171. In some embodiments, the sidewalls of the top barrier layers 137, the sidewalls of the conductive contacts 135, and the sidewalls of the bottom barrier layers 133 are covered by and in direct contact with the first lining layer 141.

In some embodiments, an isolation layer 143 is disposed adjacent to the I-shaped structures 171. In some embodiments, the isolation layer 143 is separated from the anti-reflective layers 139, the top barrier layers 137, the conductive contacts 135, the bottom barrier layers 133, and the semiconductor substrate 101 by the first lining layer 141. In addition, one or more air gaps 150 are formed in the isolation layer 143. In some embodiments, each of the air gaps 150 is sealed in the isolation layer 143.

In some embodiments, the first lining layer 141 and the isolation layer 143 extend into the semiconductor substrate 101, such that the bottom surfaces of the first lining layer 141 and the isolation layer 143 are lower than the top surface of the semiconductor substrate 101 (i.e., the interface between the semiconductor substrate 101 and the top barrier layers 133). In some embodiments, the semiconductor device 100 further includes a second barrier layer 153 disposed over the first lining layer 141 and the isolation layer 143. In some embodiments, the anti-reflective layers 139 are separated from the second lining layer 153 by the first lining layer 141.

In some embodiments, the interface between the isolation layer 143 and the second lining layer 153 is concave. That is, the top surface of the isolation layer 143 is concave, in accordance with some embodiments. It should be noted that the number of air gaps 150 per semiconductor device 100 is not limited to four, and may be less or more. In some other embodiments, the air gaps 150 are physically connected such that an air gap structure (not shown) is obtained.

In some embodiments, the materials of the bottom barrier layers 133 and the top barrier layers 137 are different from the materials of the conductive contacts 135. In some embodiments, the bottom barrier layers 133 and the top barrier layers 137 include the same material. For example, the bottom barrier layers 133 and the top barrier layers 137 include titanium (Ti), titanium nitride (TiN), or a combination thereof, and the conductive contacts 135 include aluminum (Al), copper (Cu), or a combination thereof.

In some embodiments, the materials of the first lining layer 141 and the second lining layer 153 are different from the materials of the isolation layer 143. In some embodiments, the first lining layer 141 and the second lining layer 153 include the same material. For example, the first lining layer 141 and the second lining layer 153 include silicon nitride ($Si_3N_4$), and the isolation layer 143 includes vanadium (V). In some embodiments, the isolation layer 143 includes a vanadium-containing oxide layer.

In some embodiments, the semiconductor device 100 is part of dynamic random access memory (DRAM), and each of the conductive contacts 135 forms a bit line (BL) in the DRAM. In some embodiments, the bit line (i.e., the conductive contacts 135) are electrically connected to the conductive contacts (not shown) disposed in the semiconductor substrate 101. The I-shaped structures 171 can help to form one or more air gaps 150 in the isolation layer 143 during the process of depositing the isolation layer 143. Therefore, the parasitic capacitance between the conductive contacts 135 (or bit lines) can be reduced. As a result, the overall device performance can be improved.

Figure 3:
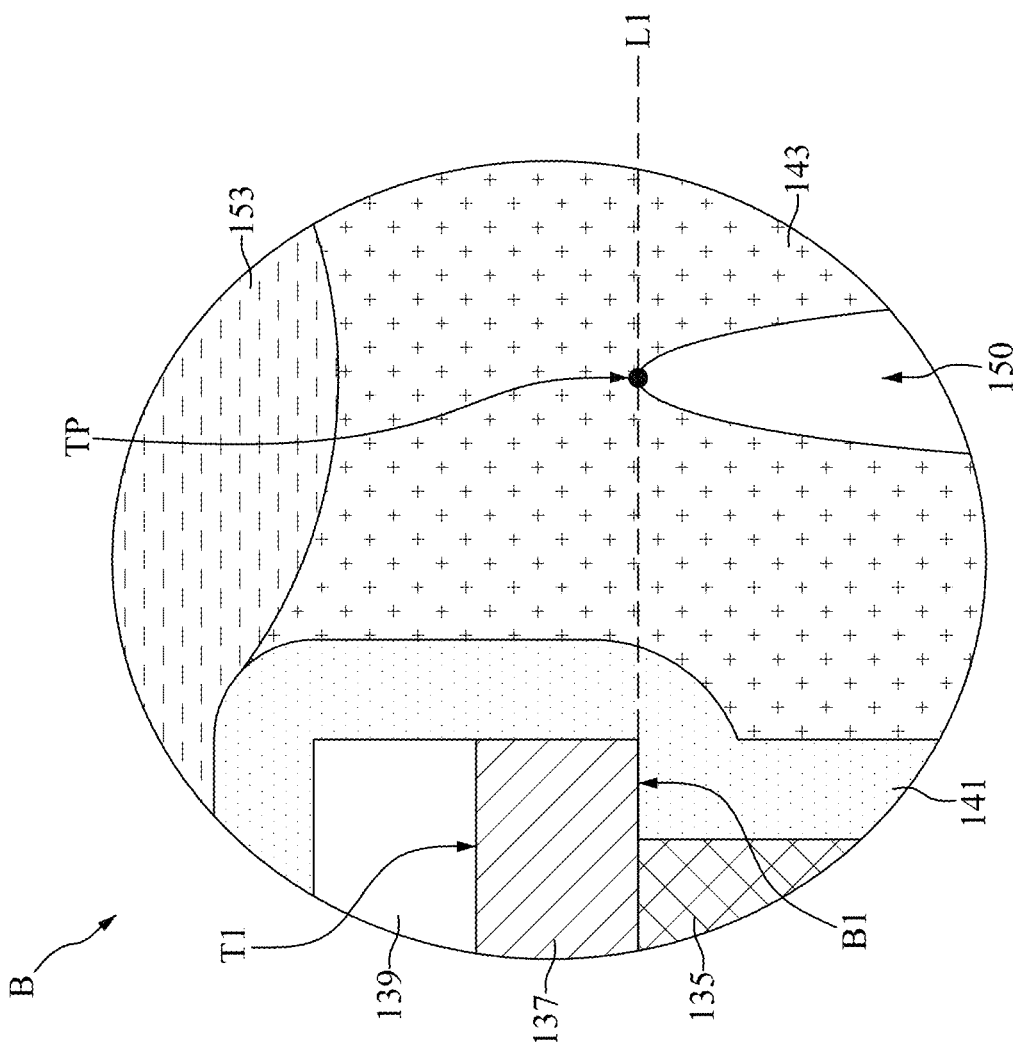
FIG. 3 is an enlarged view of a portion of the semiconductor device in FIG. 1, in accordance with some embodiments.

FIG. 3 is an enlarged view of a portion B of the semiconductor device 100 in FIG. 1, in accordance with some embodiments. As shown in FIG. 3, the air gap 150 has a topmost point TP, and the topmost point TP is substantially level with the bottom surface B1 of the top barrier layer 137, in accordance with some embodiments. For example, an extension line L1 of the bottom surface B1 of the top barrier layer 137 passes through the topmost point TP. Within the context of this disclosure, the word "substantially" means preferably at least 90%, more preferably 95%, even more preferably 98%, and most preferably 99%.

Figure 4:
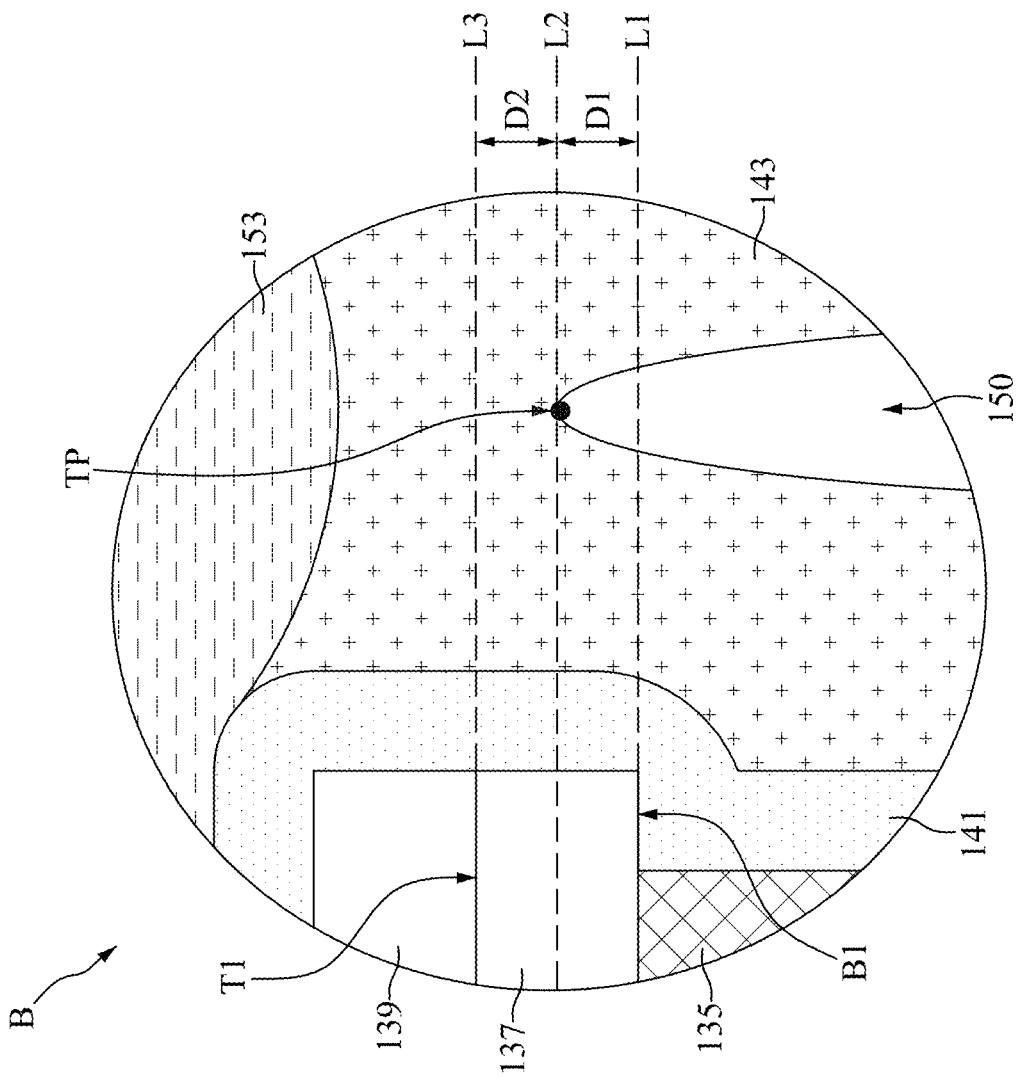
FIG. 4 is an enlarged view of a portion of the semiconductor device in FIG. 1, in accordance with some other embodiments.

FIG. 4 is an enlarged view of the portion B of the semiconductor device in FIG. 1, in accordance with some other embodiments. In the present embodiment, the top barrier layer 137 has a middle line L2, a distance D1 between the middle line L2 and the bottom surface B1 of the top barrier layer 137 is substantially equal to a distance D2 between the middle line L2 and the top surface T1 of the top barrier layer 137 (please refer to the lines L1 and L3, the line L1 is an extension line of the bottom surface B1, and the line L3 is an extension line of the top surface T1). In the present embodiment, the middle line L2 of the top barrier layer 137 passes through the topmost point TP of the air gap 150.

In some embodiments, the topmost point TP of the air gap 150 is located between the middle line L2 and the bottom surface B1 of the top barrier layer 137. If the topmost point TP of the air gap 150 is located higher than the middle line L2, the portion of the isolation layer 143 over the air gap 150 can easily collapse. If the topmost point TP of the air gap 150 is located lower than the extension line L1 of the bottom surface B1, the parasitic capacitance is not reduced effectively.

Figure 5:
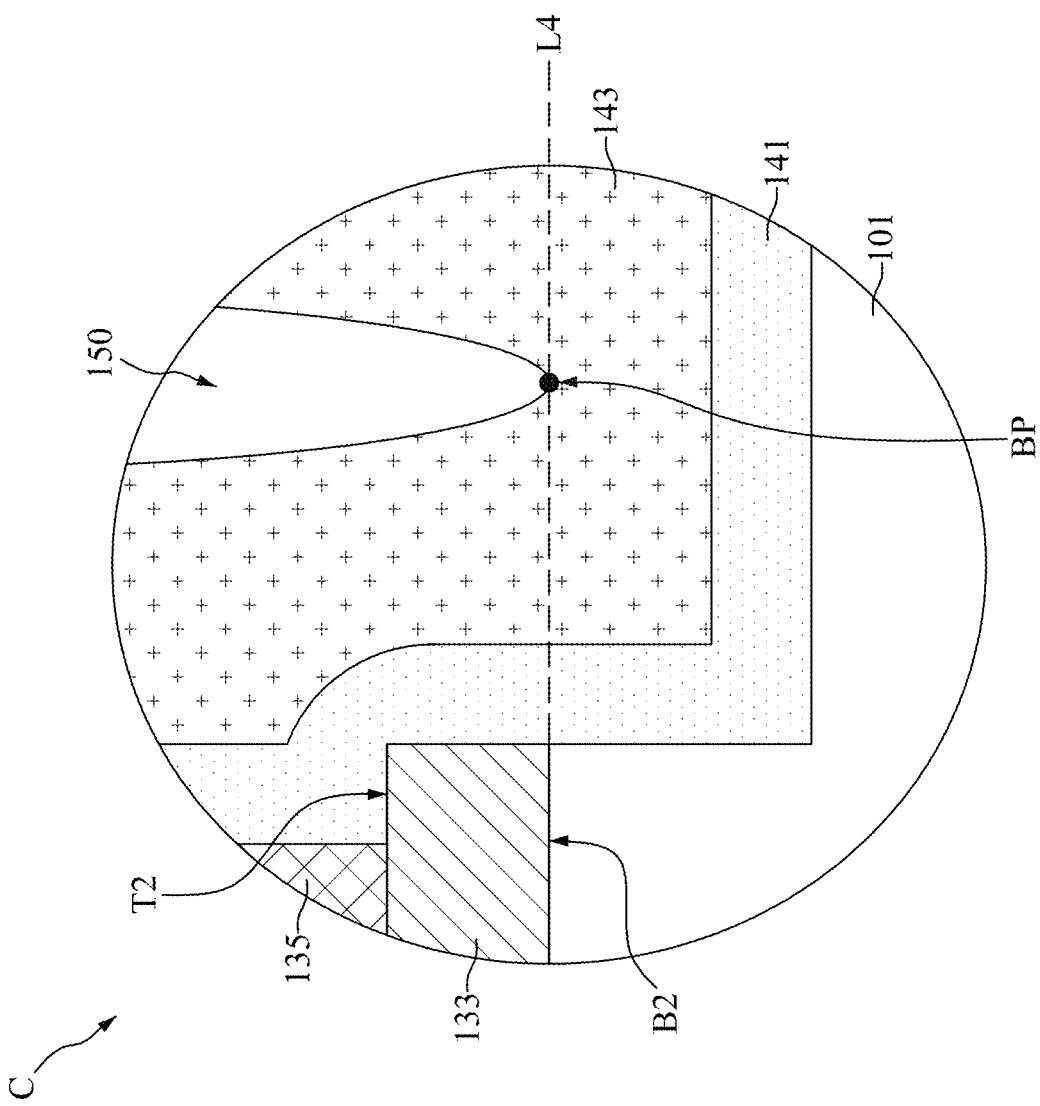
FIG. 5 is an enlarged view of a portion of the semiconductor device in FIG. 1, in accordance with some embodiments.

FIG. 5 is an enlarged view of a portion C of the semiconductor device 100 in FIG. 1, in accordance with some embodiments. As shown in FIG. 5, the air gap 150 has a bottommost point BP, and the bottommost point BP is substantially level with the bottom surface B2 of the bottom barrier layer 133, in accordance with some embodiments. For example, an extension line L4 of the bottom surface B2 of the bottom barrier layer 133 passes through the bottommost point BP.

Figure 6:
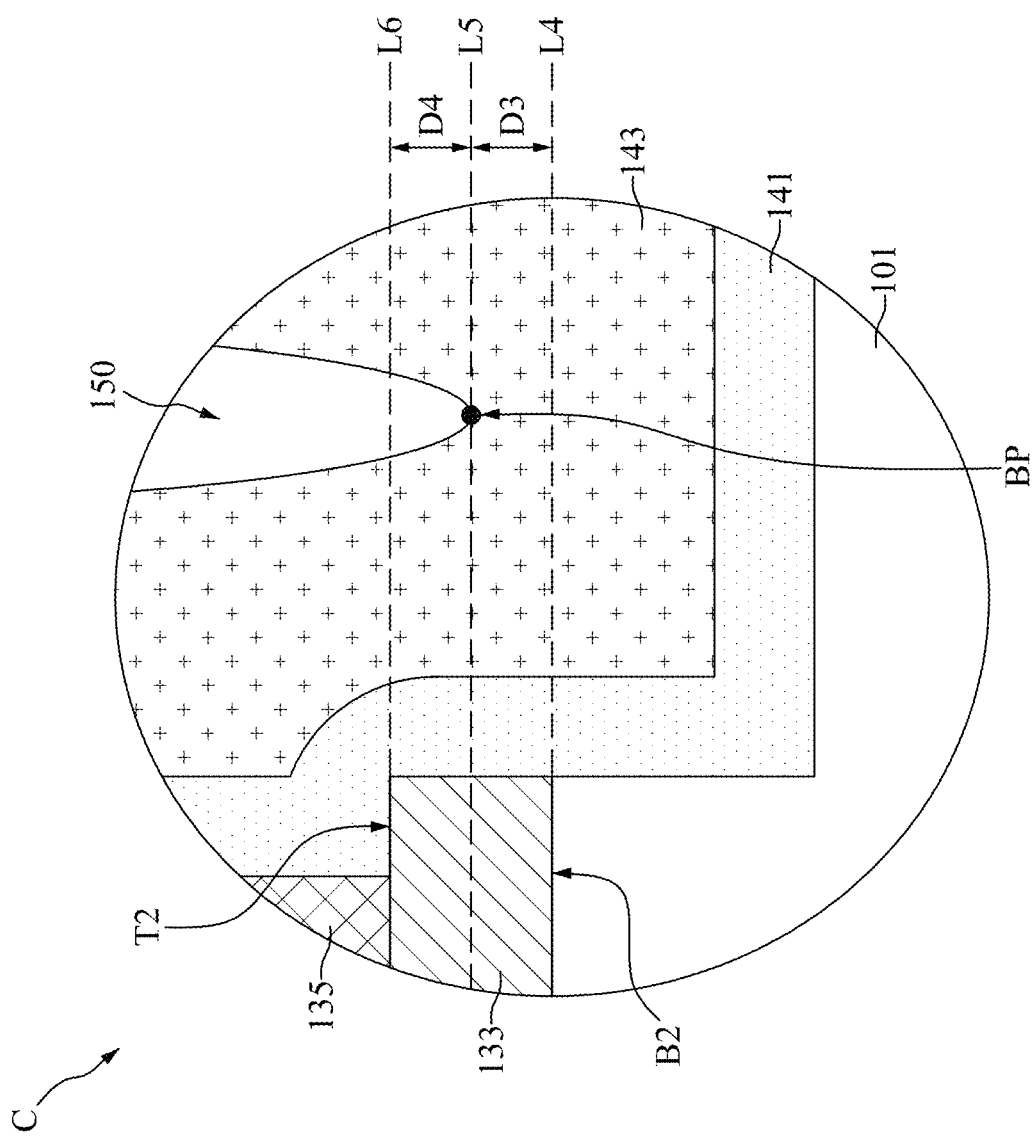
FIG. 6 is an enlarged view of a portion of the semiconductor device in FIG. 1, in accordance with some other embodiments.

FIG. 6 is an enlarged view of the portion C of the semiconductor device in FIG. 1, in accordance with some other embodiments. In the present embodiment, the bottom barrier layer 133 has a middle line L5, a distance D3 between the middle line L5 and the bottom surface B2 of the bottom barrier layer 133 is substantially equal to a distance D4 between the middle line L5 and the top surface T2 of the bottom barrier layer 133 (please refer to the lines L4 and L6, the line L4 is an extension line of the bottom surface B2, and the line L6 is an extension line of the top surface T2). In the present embodiment, the middle line L5 of the bottom barrier layer 133 passes through the bottommost point BP of the air gap 150.

In some embodiments, the bottommost point BP of the air gap 150 is located between the middle line L5 and the bottom surface B2 of the bottom barrier layer 133. If the bottommost point BP of the air gap 150 is located higher than the middle line L5, the parasitic capacitance is not reduced effectively. If the bottommost point BP of the air gap 150 is located lower than the extension line L4 of the bottom surface B2, the isolation layer 143 can easily collapse.

Figure 7:
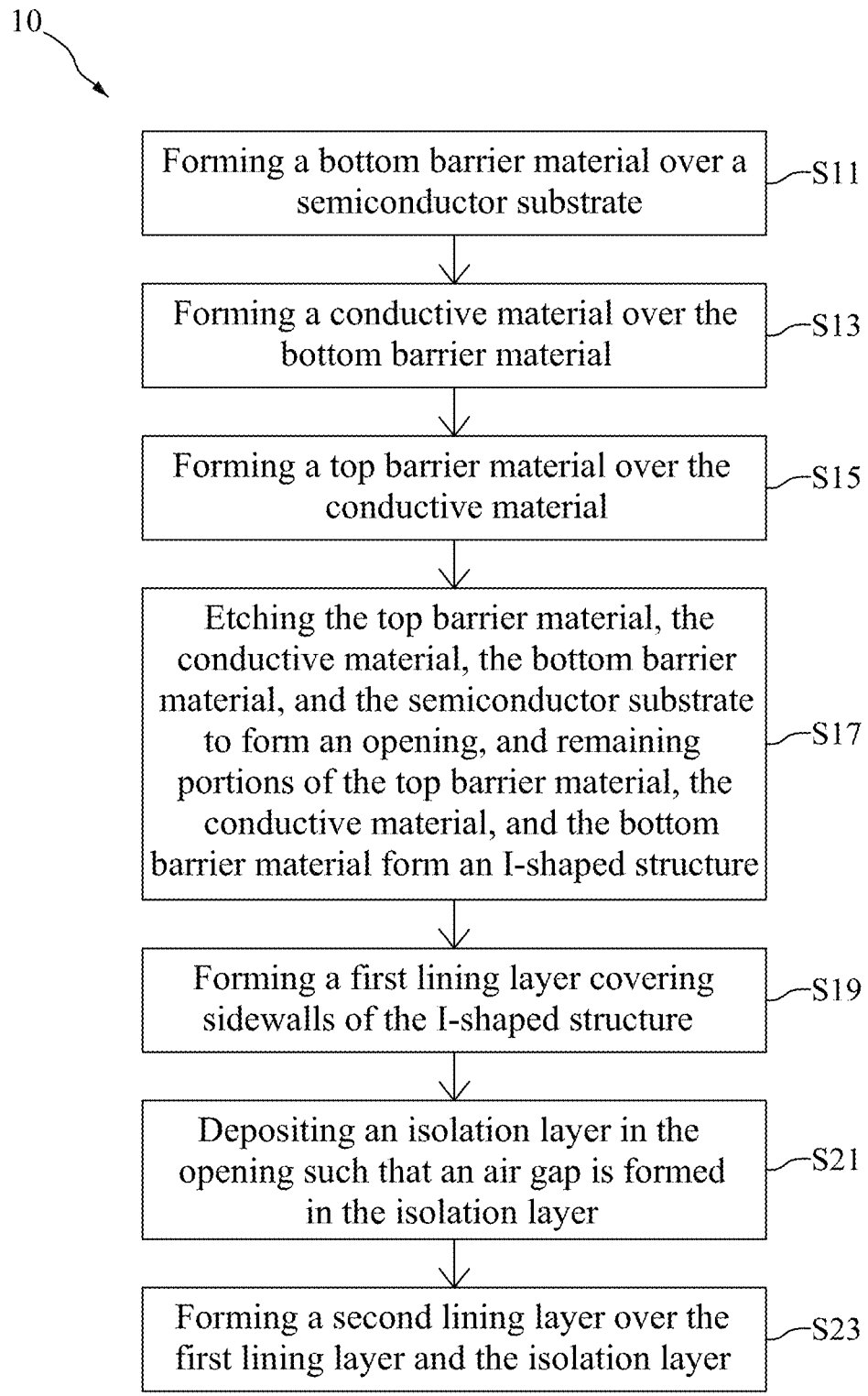
FIG. 7 is a flow diagram illustrating a method for preparing a semiconductor device, in accordance with some embodiments.

FIG. 7 is a flow diagram illustrating a method 10 for preparing a semiconductor device (e.g., the semiconductor device 100), and the method 10 includes steps S11, S13, S15, S17, S19, S21 and S23, in accordance with some embodiments. The steps S11 to S23 of FIG. 7 are elaborated in connection with the following figures.

FIGS. 8-13, 15, 16, 18 and 19 are cross-sectional views illustrating intermediate stages in the formation of the semiconductor device 100, in accordance with some embodiments. FIG. 14 is an enlarged view of a portion of the semiconductor device 100 in FIG. 13, and FIG. 17 is a cross-sectional view taken along line A-A' in FIG. 16, in accordance with some embodiments.

Figure 8:
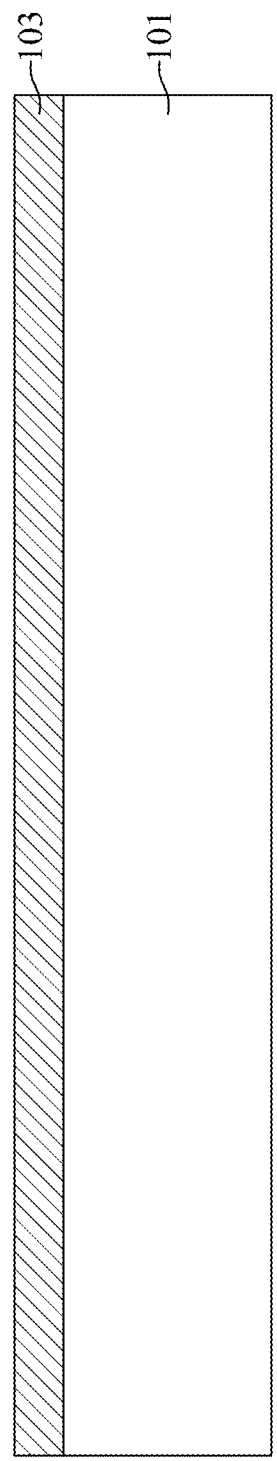
FIG. 8 is a cross-sectional view illustrating an intermediate stage of forming a bottom barrier material over a semiconductor substrate during the formation of the semiconductor device, in accordance with some embodiments.

As shown in FIG. 8, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Moreover, in some embodiments, a plurality of source/drain regions (not shown) are formed in the semiconductor substrate 101.

A bottom barrier material 103 is formed over the semiconductor substrate 101, as shown in FIG. 8 in accordance with some embodiments. The respective step is illustrated as the step S11 in the method 10 shown in FIG. 7. In some embodiments, the bottom barrier material 103 includes Ti, TiN, or a combination thereof. The bottom barrier material 103 may be formed by a deposition process, such as a chemical vapor deposition (CVD) process, a physical vapor deposition (PVD) process, an atomic layer deposition (ALD) process, a spin-on coating process, a sputtering process, or another suitable method.

Figure 9:
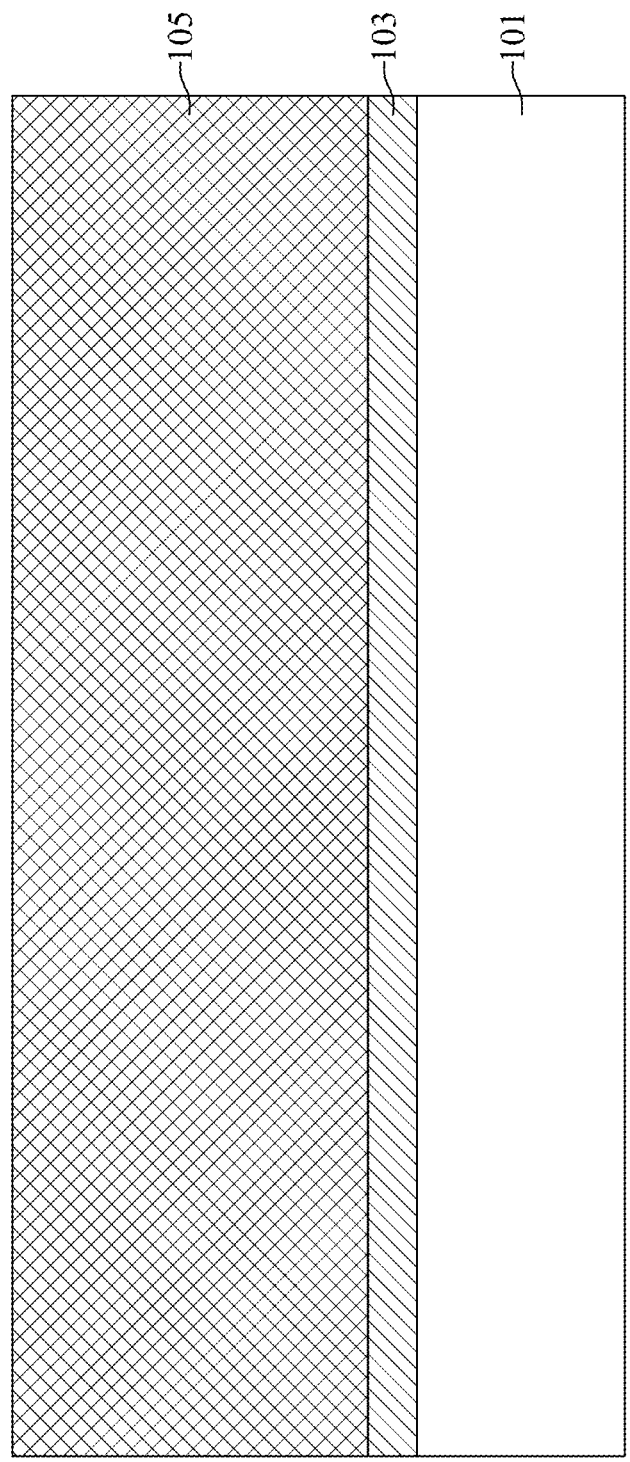
FIG. 9 is a cross-sectional view illustrating an intermediate stage of forming a conductive material over the bottom barrier material during the formation of the semiconductor device, in accordance with some embodiments.

Next, a conductive material 105 is formed over the bottom barrier material 103, as shown in FIG. 9 in accordance with some embodiments. The respective step is illustrated as the step S13 in the method 10 shown in FIG. 7. In some embodiments, the conductive material 105 includes Al, Cu, a combination thereof, or another suitable conductive material. However, any other suitable materials, such as tungsten (W), titanium (Ti), tantalum (Ta), gold (Au), silver (Ag), may be utilized. Some processes used to form the conductive material 105 are similar to, or the same as those used to form the bottom barrier material 103 and details thereof are not repeated herein.

Figure 10:
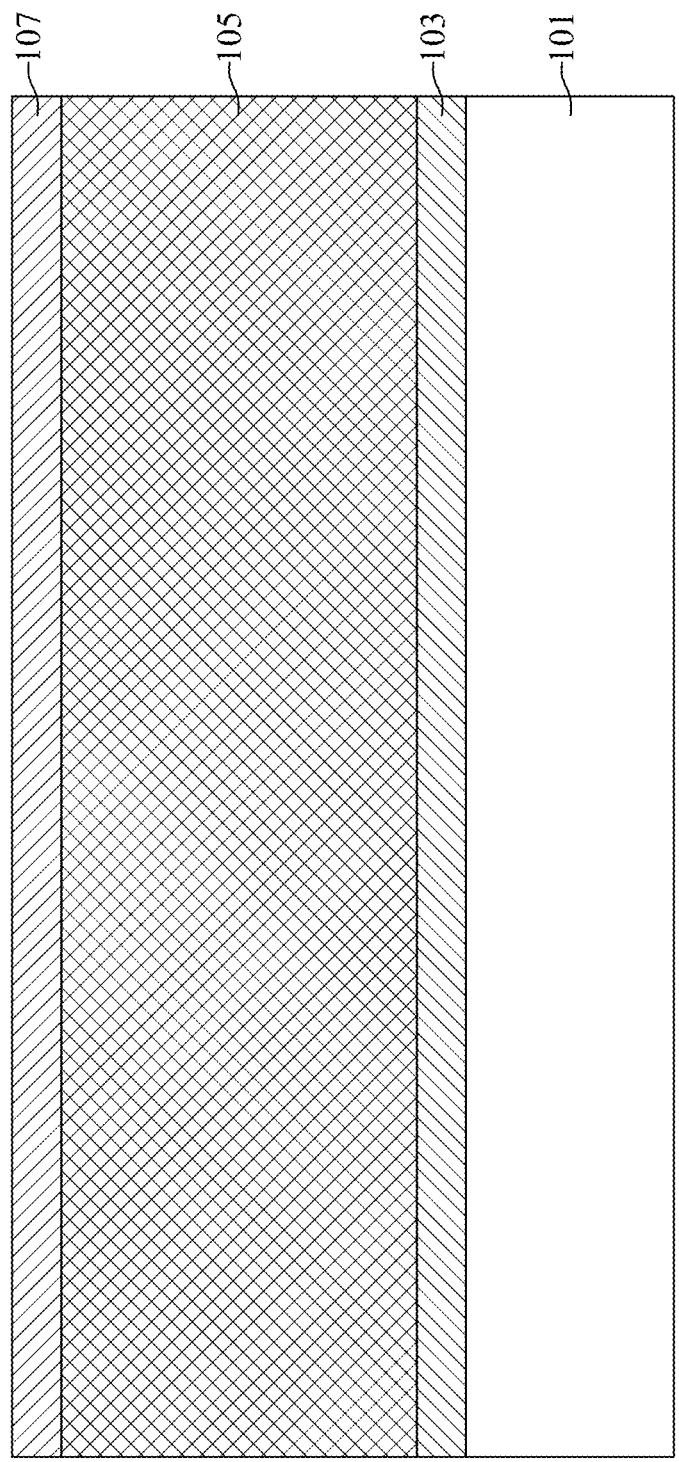
FIG. 10 is a cross-sectional view illustrating an intermediate stage of forming a top barrier material over the conductive material during the formation of the semiconductor device, in accordance with some embodiments.

Then, a top barrier material 107 is formed over the conductive material 105, as shown in FIG. 10 in accordance with some embodiments. The respective step is illustrated as the step S15 in the method 10 shown in FIG. 7. In some embodiments, the top barrier material 107 includes Ti, TiN, or a combination thereof. Some processes used to form the top barrier material 107 are similar to, or the same as those used to form the bottom barrier material 103 and details thereof are not repeated herein.

Figure 11:
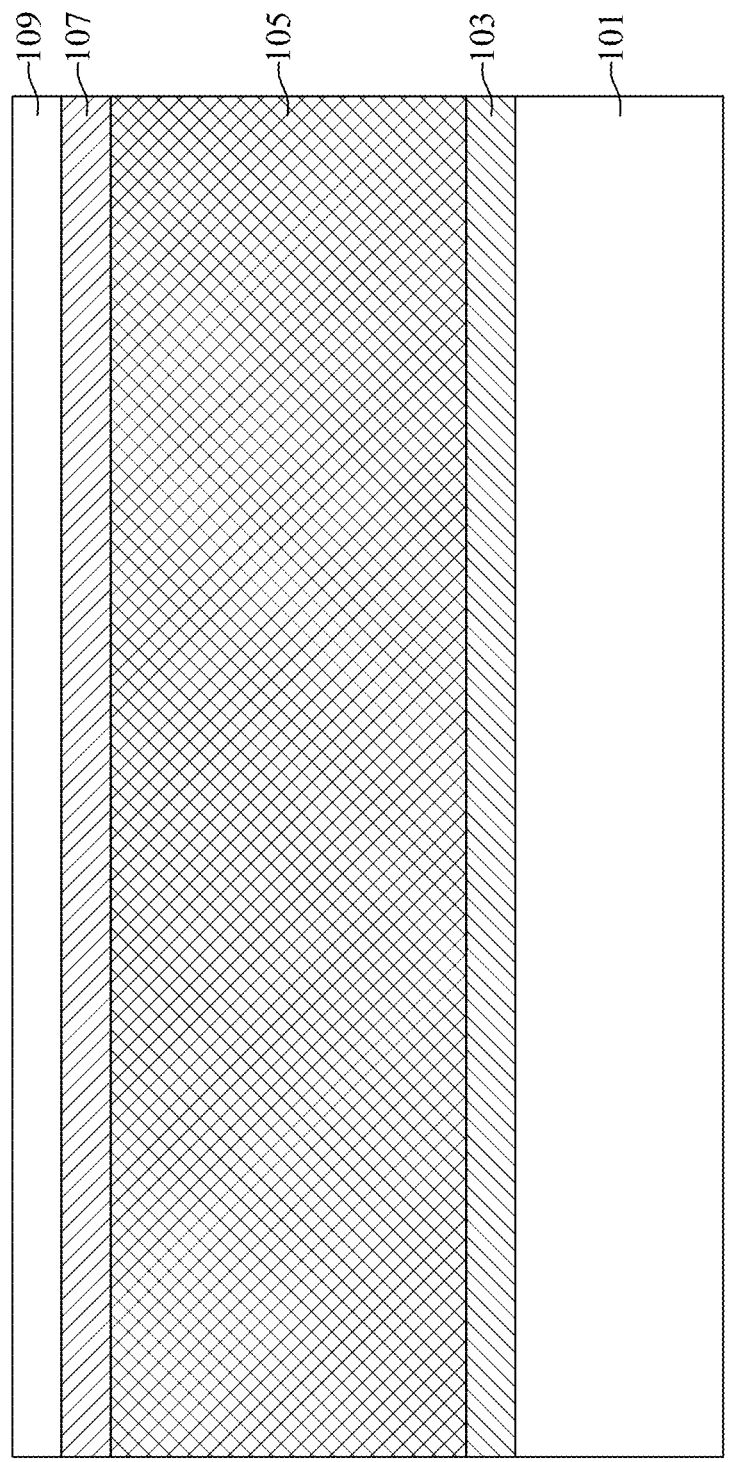
FIG. 11 is a cross-sectional view illustrating an intermediate stage of forming an anti-reflective material over the top barrier material during the formation of the semiconductor device, in accordance with some embodiments.

Subsequently, an anti-reflective material 109 is formed over the top barrier material 107, as shown in FIG. 11 in accordance with some embodiments. In some embodiments, the anti-reflective material 109 is a dielectric anti-reflective coating (DARC) such as silicon oxynitride (SiON). The anti-reflective material 109 can be used to improve lithography quality and provide extra protection during subsequent etching process.

Figure 12:
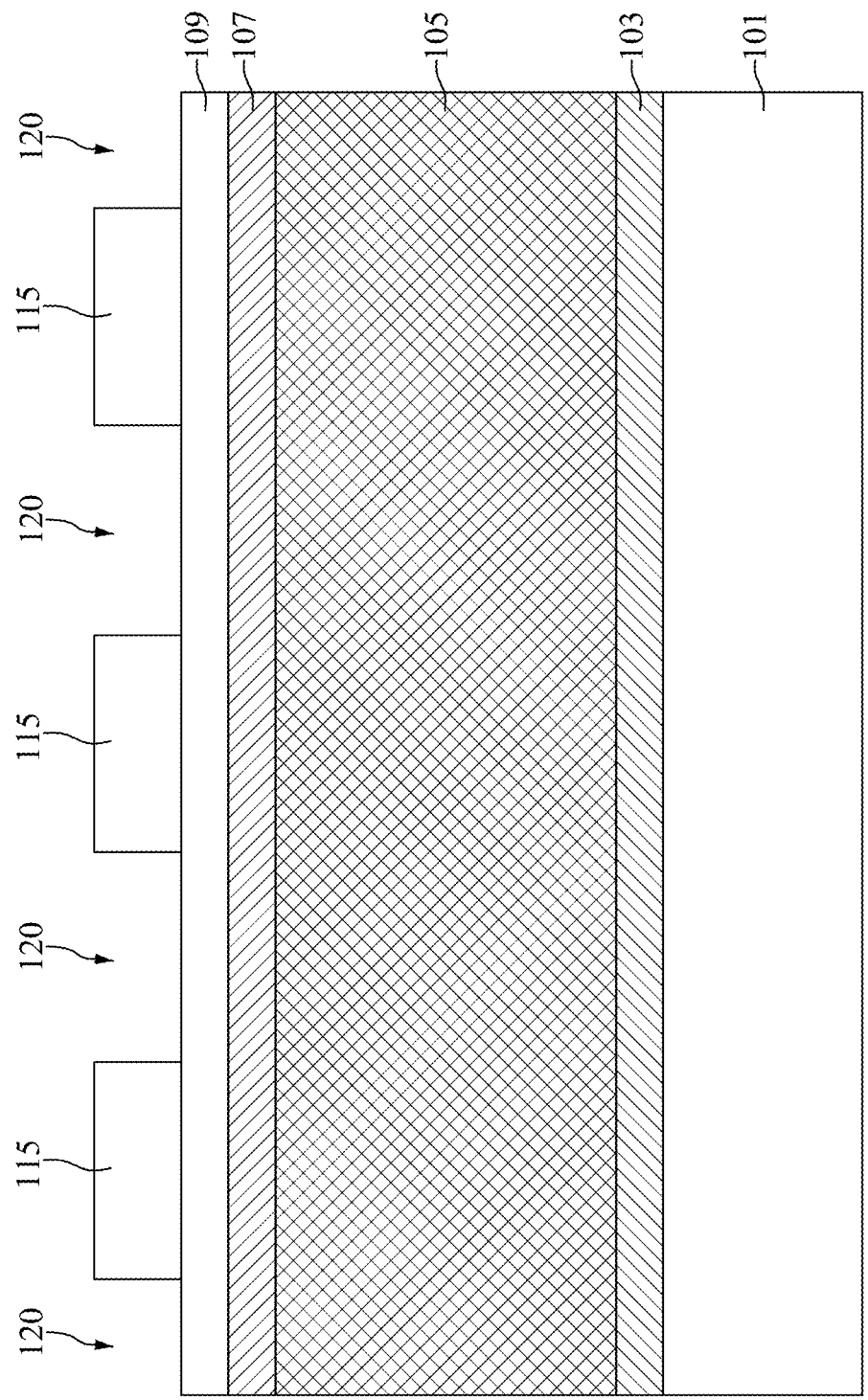
FIG. 12 is a cross-sectional view illustrating an intermediate stage of forming a patterned mask over the anti-reflective material during the formation of the semiconductor device, in accordance with some embodiments.

Next, a patterned mask 115 with a plurality of openings 120 is formed over the anti-reflective material 109, as shown in FIG. 12 in accordance with some embodiments. In some embodiments, the anti-reflective material 109 is partially exposed by the openings 120. In some embodiments, the anti-reflective material 109 and the patterned mask 115 include different materials so that the etching selectivities may be different in the subsequent etching process.

Then, an etching process is performed on the anti-reflective material 109, the top barrier material 107, the conductive material 105, the bottom barrier material 103, and the semiconductor substrate 101 using the patterned mask 115 as a mask, such that a plurality of openings 130 are formed, as shown in FIG. 13 in accordance with some embodiments. After the etching process is performed, the remaining portions of the anti-reflective material 109 forms a plurality of anti-reflective layers 139, the remaining portions of the top barrier material 107 form a plurality of top barrier layers 137, the remaining portions of the conductive material 105 form a plurality of conductive contacts 135, and the remaining portions of the bottom barrier material 103 form a plurality of bottom barrier layers 133.

In some embodiments, each of the conductive contacts 135 and its corresponding top barrier layer 139 and bottom barrier layer 133 form an I-shaped structure 171. For example, each of the bottom barrier layers 133 has a width W1, each of the conductive contacts 135 has a width W2, and each of the top barrier layers 137 has a width W3. And the width W1 and the width W3 are greater than the width W2. In some embodiments, since the bottom barrier layers 133 and the top barrier layers 137 include the same material, the width W1 is substantially the same as the width W3. In some embodiments, the width of each of the anti-reflective layers 115 is substantially the same as the width W3 of each of the top barrier layers 137. The respective step is illustrated as the step S17 in the method 10 shown in FIG. 7.

Moreover, the semiconductor substrate 101 is partially removed during the etching process for forming the opening 130, in accordance with some embodiments. In some embodiments, sidewalls S1 of the semiconductor substrate 101 are exposed by the openings 130. In some embodiments, the etching process for forming the openings 130 includes a dry etching process using a chlorine-based etchant.

FIG. 14 is an enlarged view of a portion D of the semiconductor device 100 in FIG. 13, in accordance with some embodiments. In some embodiments, each of the openings 130 includes a lower portion 130a, a middle portion 130b, and an upper portion 130c. In some embodiments, the lower portion 130a of the opening 130 has a width W4, the middle portion 130b of the opening 130 has a width W5, the upper portion 130c of the opening 130 has a width W6, and the width W5 is greater than the width W4 and the width W6.

After the openings 130 are formed, the patterned mask 115 may be removed, as shown in FIG. 15 in accordance with some embodiments. In some embodiments, the patterned mask 115 is removed by a stripping process, an ashing process, an etching process, or another suitable process.

Subsequently, a first lining layer 141 is formed covering the sidewalls of the I-shaped structures 171, such that the remaining openings 130' are obtained, as shown in FIGS. 16 and 17 in accordance with some embodiments. FIG. 17 is a cross-sectional view taken along line A-A' in FIG. 16. The respective step is illustrated as the step S19 in the method 10 shown in FIG. 7.

In some embodiments, the sidewalls S1 of the semiconductor substrate, the sidewalls S2 of the bottom barrier layers 133, the sidewalls S3 of the conductive contacts 135, the sidewalls S4 of the top barrier layers 137, and the sidewalls S5 of the anti-reflective layers 139 are covered by and indirect contact with the first lining layer 141. In some embodiments, the first lining layer 141 includes silicon nitride ($Si_3N_4$). In some embodiments, the first lining layer 141 is formed by an ALD process.

Subsequently, an isolation layer 143 is deposited in the remaining openings 130' such that a plurality of air gaps 150 are formed in the isolation layer 143, as shown in FIG. 18 in accordance with some embodiments. The respective step is illustrated as the step S21 in the method 10 shown in FIG. 7. In some embodiments, the isolation layer 143 extends over the I-shaped structures 171 and the anti-reflective layers 139.

In some embodiments, the material of the isolation layer 143 is selected to help ensure that each of the air gaps 150 is sealed in the isolation layer 143, and the isolation layer 143 can provide support and stability for the structure. That is, the isolation layer 143 will not collapse into the air gaps 150. In some embodiments, the anti-reflective layers 139, the top barrier layers 137, the conductive contacts 135, the bottom barrier layers 133, and the semiconductor substrate 101 are separated from the isolation layer 143 by the first lining layer 141.

In some embodiments, the isolation layer 143 includes vanadium (V). In some embodiments, the isolation layer 143 includes a vanadium-containing oxide layer. In addition, the isolation layer 143 is formed by an ALD process, in accordance with some embodiments.

In some embodiments, the I-shaped structures 171 can help to form the air gaps 150 in the isolation layer during the process of depositing the isolation layer 143. Therefore, the parasitic capacitance between the conductive contacts 135 and adjacent conductive features can be reduced. As a result, the overall device performance can be improved.

Next, the isolation layer 143 is partially removed such that recesses 160 are formed over the air gaps 150, as shown in FIG. 19 in accordance with some embodiments. In some embodiments, excess portions of the isolation layer 143 over the I-shaped structures 171 and the anti-reflective layers 137 are removed such that the first lining layer 141 is exposed. In some embodiments, since the recesses 160 are formed, the top surface T4 of the isolation layer 143 is concave. In some embodiments, the isolation layer 143 is partially removed by an etching process, a chemical mechanical polishing (CMP) process, a grinding process, or another suitable process.

Then, a second lining layer 153 is formed over the first lining layer 141 and the isolation layer 143, as shown in FIG. 1 in accordance with some embodiments. The respective step is illustrated as the step S23 in the method 10 shown in FIG. 7. In some embodiments, the recesses 160 are filled by the second lining layer 153, and the second lining layer 153 extends to cover the exposed portions of the first lining layer 141.

Moreover, in some embodiments, the second lining layer 153 and the first lining layer 141 include the same material. For example, the second lining layer 153 and the first lining layer 141 include $Si_3N_4$. In addition, the second lining layer 153 is formed by an ALD process, in accordance with some embodiments.

In some embodiments, the interface between the second lining layer 153 and the first lining layer 141 (i.e., the top surface T4 of the isolation layer 143, as shown in FIG. 19) is concave. After the second lining layer 153 is formed, the semiconductor device 100 is obtained. In some embodiments, the semiconductor device 100 is part of dynamic random access memory (DRAM), and each of the conductive contacts 135 forms a bit line (BL) in the DRAM.

Embodiments of a semiconductor device and method for preparing the same are provided in the disclosure. In some embodiments, the semiconductor device includes a bottom barrier layer (e.g., the bottom barrier layer 133), a conductive contact (e.g., the conductive contact 135) disposed over the bottom barrier layer, and a top barrier layer (e.g., the top barrier layer 139) disposed over the conductive contact. The bottom barrier layer, the conductive contact, and the top barrier layer collectively form an I-shaped structure. For example, the width of the conductive contact is greater than the widths of the top barrier layer and the bottom barrier layer. In some embodiments, the semiconductor device also includes an isolation layer (e.g., the isolation layer 143) disposed adjacent to the I-shaped structure. During the process of depositing the isolation layer, an air gap can be formed in the isolation layer due to the formation of the I-shaped structure.

Moreover, the material of the isolation layer is selected to help ensure that air gap is sealed in the isolation layer, and the isolation layer can provide support and stability for the structure. For example, the material of the isolation layer includes vanadium. As a result, the parasitic capacitance between the conductive contact and adjacent conductive features can be reduced, and the overall device performance can be improved.

In one embodiment of the present disclosure, a semiconductor device is provided. The semiconductor device includes a bottom barrier layer disposed over a semiconductor substrate, and a conductive contact disposed over the bottom barrier layer. The semiconductor device also includes a top barrier layer disposed over the conductive contact. The bottom barrier layer, the conductive contact, and the top barrier layer form an I-shaped structure. The semiconductor device further includes an isolation layer disposed adjacent to the I-shaped structure and extending into the semiconductor substrate. An air gap is surrounded by the isolation layer.

In another embodiment of the present disclosure, a semiconductor device is provided. The semiconductor device includes a bottom barrier layer disposed over a semiconductor substrate, and a conductive contact disposed over the bottom barrier layer. The semiconductor device also includes a top barrier layer disposed over the conductive contact. A width of the bottom barrier layer and a width of the top barrier layer are greater than a width of the conductive contact. The semiconductor device further includes an isolation layer disposed adjacent to the conductive contact and extending into the semiconductor substrate. An air gap is sealed in the isolation layer.

In yet another embodiment of the present disclosure, a method for preparing a semiconductor device is provided. The method includes forming a bottom barrier material over a semiconductor substrate, and forming a conductive material over the bottom barrier material. The method also includes forming a top barrier material over the conductive material, and etching the top barrier material, the conductive material, the bottom barrier material, and the semiconductor substrate to form an opening. Remaining portions of the top barrier material, the conductive material, and the bottom barrier material form an I-shaped structure. The method further includes depositing an isolation layer in the opening such that an air gap is formed in the isolation layer.

The embodiments of the present disclosure have some advantageous features. In some embodiments, the semiconductor device includes a bottom barrier layer, a conductive contact disposed over the bottom barrier layer, and a top barrier layer disposed over the conductive contact. The bottom barrier layer, the conductive contact, and the top barrier layer collectively form an I-shaped structure. In some embodiments, the semiconductor device also includes an isolation layer disposed adjacent to the I-shaped structure. The I-shaped structure can help to form an air gap in the isolation layer during the process of depositing the isolation layer. Therefore, the parasitic capacitance between the conductive contact and adjacent conductive features can be reduced. As a result, the overall device performance can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a bottom barrier material over a semiconductor substrate;
    forming a conductive material over the bottom barrier material;
    forming a top barrier material over the conductive material;
    etching the top barrier material, the conductive material, the bottom barrier material, and the semiconductor substrate to form an opening, wherein remaining portions of the top barrier material, the conductive material, and the bottom barrier material form an I-shaped structure;
    depositing an isolation layer in the opening such that an air gap is formed in the isolation layer; and
    forming an anti-reflective material over the top barrier material before the opening is formed, wherein the anti-reflective material is etched during the forming of the opening.

2. The method for preparing a semiconductor device of claim 1, wherein the isolation layer includes vanadium, and the isolation layer is deposited by an atomic layer deposition (ALD) process.

3. The method for preparing a semiconductor device of claim 1, wherein the remaining portion of the bottom barrier layer has a first width, the remaining portion of the conductive contact has a second width, and the remaining portion of the top barrier layer has a third width, and
    wherein the first width is substantially the same as the third width, and the second width is greater than the first width.

4. The method for preparing a semiconductor device of claim 1, wherein the opening is formed by a dry etching process using a chlorine-based etchant.

5. The method for preparing a semiconductor device of claim 1, wherein a lower portion of the opening has a fourth width, a middle portion of the opening has a fifth width, and an upper portion of the opening has a sixth width, and
   wherein the fifth width is greater than the fourth width and the sixth width.

6. The method for preparing a semiconductor device of claim 1, further comprising:
   forming a first lining layer covering sidewalls of the I-shaped structure before the isolation layer is deposited.

7. The method for preparing a semiconductor device of claim 6, further comprising:
   forming a second lining layer over the first lining layer and the isolation layer, wherein a material of the first lining layer is the same as a material of the second lining layer.

* * * * *